United States Patent
Girardey et al.

(10) Patent No.: US 10,606,228 B2
(45) Date of Patent: Mar. 31, 2020

(54) MEASUREMENT TRANSDUCER HAVING A MONITORING FUNCTION

(71) Applicant: Endress + Hauser GmbH + Co. KG, Maulburg (DE)

(72) Inventors: Romuald Girardey, Blotzheim (FR); Ralph Stib, Schonau (DE); Manuel Sautermeister, Steinen (DE); Lars Karweck, Binzen (DE); Andreas Spitz, Schopfheim (DE); Thomas Zieringer, Schopfheim (DE)

(73) Assignee: ENDRESS+HAUSER SE+ CO. KG, Maulburg (DE)

( * ) Notice: Subject to any disclaimer, the term of this patent is extended or adjusted under 35 U.S.C. 154(b) by 350 days.

(21) Appl. No.: 15/107,137

(22) PCT Filed: Nov. 17, 2014

(86) PCT No.: PCT/EP2014/074714
§ 371 (c)(1),
(2) Date: Jun. 22, 2016

(87) PCT Pub. No.: WO2015/096933
PCT Pub. Date: Jul. 2, 2015

(65) Prior Publication Data
US 2017/0010597 A1 Jan. 12, 2017

(30) Foreign Application Priority Data

Dec. 23, 2013 (DE) .......... 10 2013 021 780
Feb. 17, 2014 (DE) .......... 10 2014 101 945

(51) Int. Cl.
*G05B 19/042* (2006.01)
*G01D 18/00* (2006.01)
(Continued)

(52) U.S. Cl.
CPC .......... *G05B 19/0425* (2013.01); *G01D 5/14* (2013.01); *G01D 18/00* (2013.01); *G01D 21/00* (2013.01);
(Continued)

(58) Field of Classification Search
CPC .......... G05B 19/0425; G05B 23/0235; G05B 23/0237; G05B 2219/24015;
(Continued)

(56) References Cited

U.S. PATENT DOCUMENTS

| | | | | |
|---|---|---|---|---|
| 4,916,556 A | * | 4/1990 | Sander | G06F 3/0601 360/45 |
| 4,916,704 A | * | 4/1990 | Bruckert | G06F 11/165 714/11 |

(Continued)

FOREIGN PATENT DOCUMENTS

| | | | | |
|---|---|---|---|---|
| CN | 100474452 C | * | 4/2009 | G11C 11/5628 |
| CN | 103454485 A | | 12/2013 | |

(Continued)

OTHER PUBLICATIONS

German Search Report, German Patent Office, Munich, DE, dated Nov. 10, 2014.
(Continued)

*Primary Examiner* — Alexander Satanovsky
*Assistant Examiner* — Douglas Kay
(74) *Attorney, Agent, or Firm* — Bacon & Thomas, PLLC

(57) ABSTRACT

A measurement transducer, comprising: a sensor module having a sensor element, sensor electronics and a main electronics module. The sensor element emits sensor signals, and the sensor electronics processes the digitized sensor signals with a transmission function and provides processed sensor measurement values on a digital interface. The main electronics module is functionally connected to the sensor
(Continued)

electronics and a logic unit, and a communications interface. The logic unit is configured to receive the sensor measurement values provided on the digital interface and to cause the output of a measurement signal corresponding to the sensor measurement values through the communications interface. The logic unit is configured to carry out a monitoring function. The monitoring comprises, in addition to a currently provided sensor measurement value, the reception of the associated digitized sensor signals, with the aid of a test function which comprises the transmission function. The logic unit is also configured to provide the control measurement value to the sensor electronics, wherein the sensor electronics is configured to carry out a comparison between the control measurement value and the sensor measurement value and to cause the communications interface, via an alarm output, to directly emit an error signal in the event of deviations.

8 Claims, 1 Drawing Sheet

(51) Int. Cl.
G01R 31/28 (2006.01)
G01D 21/00 (2006.01)
H04B 17/17 (2015.01)
G01D 5/14 (2006.01)
G01R 35/00 (2006.01)
G05B 23/02 (2006.01)

(52) U.S. Cl.
CPC ......... *G01R 31/2829* (2013.01); *G01R 35/00* (2013.01); *H04B 17/17* (2015.01); *G05B 23/0235* (2013.01); *G05B 23/0237* (2013.01); *G05B 2219/24015* (2013.01); *G05B 2219/25428* (2013.01); *G05B 2219/33331* (2013.01)

(58) Field of Classification Search
CPC ........... G05B 2219/25428; G05B 2219/33331; G01D 5/14; G01D 18/00; G01D 21/00; G01R 31/2829; G01R 35/00; H04B 17/17
USPC ........................................................ 702/104
See application file for complete search history.

(56) References Cited

U.S. PATENT DOCUMENTS

| | | | | |
|---|---|---|---|---|
| 5,005,174 A | * | 4/1991 | Bruckert | G06F 1/12 714/11 |
| 6,081,698 A | * | 6/2000 | Moriyama | H01Q 3/267 330/149 |
| 6,504,142 B2 | * | 1/2003 | Nixon | B60R 1/088 250/214 C |
| 6,737,629 B2 | * | 5/2004 | Nixon | B60R 1/088 250/214 C |
| 8,271,227 B2 | * | 9/2012 | Matzen | H04Q 9/00 702/127 |
| 9,194,718 B2 | | 11/2015 | Matzen | |
| 9,377,330 B2 | | 6/2016 | Pichto | |
| 9,823,276 B2 | | 11/2017 | Varnak | |
| 2002/0100865 A1 | * | 8/2002 | Nixon | B60R 1/088 250/214 C |
| 2003/0052172 A1 | * | 3/2003 | Lucera | G06K 7/10811 235/462.25 |
| 2003/0122060 A1 | * | 7/2003 | Nixon | B60R 1/088 250/214 C |
| 2004/0222359 A1 | * | 11/2004 | Nixon | B60R 1/088 250/214 C |
| 2005/0097296 A1 | * | 5/2005 | Chamberlain | G06F 12/023 711/170 |
| 2005/0168343 A1 | | 8/2005 | Longsdorf | |
| 2007/0156357 A1 | * | 7/2007 | Lalla | G01D 9/005 702/57 |
| 2007/0273508 A1 | * | 11/2007 | Lalla | G05B 19/0421 340/540 |
| 2009/0021414 A1 | | 1/2009 | Breton | |
| 2009/0183575 A1 | * | 7/2009 | Matzen | G01D 3/028 73/861.08 |
| 2012/0278042 A1 | * | 11/2012 | Matzen | G01D 3/036 702/183 |
| 2013/0178176 A1 | * | 7/2013 | Pichot | G01D 18/00 455/115.1 |
| 2013/0325381 A1 | * | 12/2013 | Varnak | G01R 19/0092 702/64 |
| 2014/0192913 A1 | * | 7/2014 | Bogdan | H03H 17/0251 375/260 |

FOREIGN PATENT DOCUMENTS

| | | |
|---|---|---|
| DE | 102007022991 A1 | 11/2008 |
| DE | 102009050645 A1 | 4/2011 |
| DE | 102014101945 A1 | 6/2015 |
| EP | 2613463 A2 | 7/2013 |

OTHER PUBLICATIONS

International Search Report, EPO, The Netherlands, dated Jan. 28, 2015.
English Translation of the International Preliminary Report on Patentability, WIPO, Geneva, CH, dated Jul. 7, 2016.

* cited by examiner

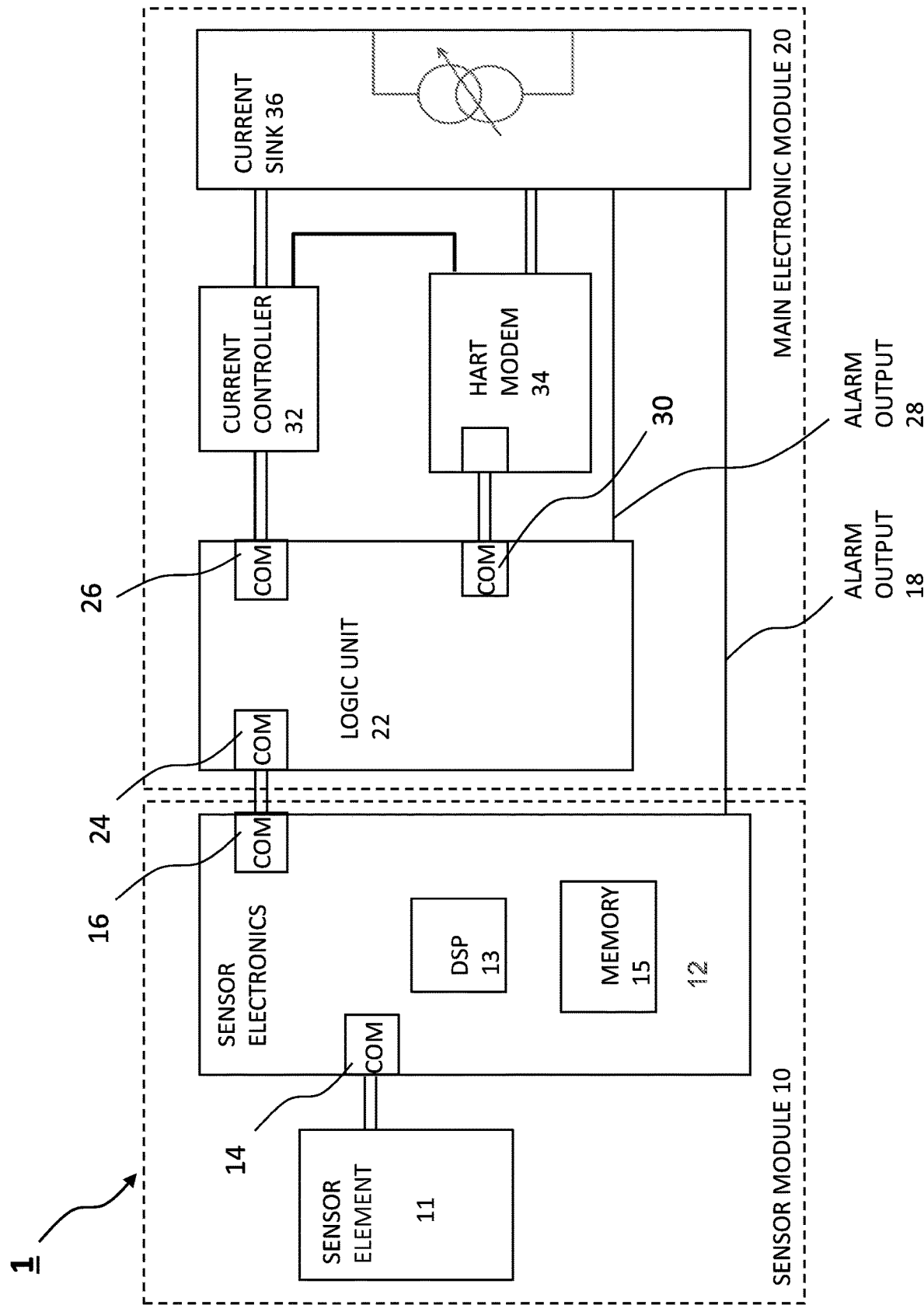

MEASUREMENT TRANSDUCER HAVING A MONITORING FUNCTION

BACKGROUND OF THE INVENTION

The present invention relates to a measurement transducer with a monitoring function—in particular, a measurement transducer of industrial process measurement technology with a monitoring function. Measurement transducers of industrial process measurement technology are commonly used in process control systems to measure measured variables, such as pressure, flow rate, filling level, temperature, and material parameters, such as pH, conductivity, toughness, density, humidity, proportion of dissolved gas, or mixing ratio of components, and to output a measured value representing the measured variable. In particular, with safety-critical applications, more stringent requirements are established to make sure that the operation of the measurement transducer is being monitored, to the effect that an error with the measurement transducer does not remain undetected. This includes, for example, the certification of measurement transducers according to the so-called SIL standard of the international standard IEC 61508 on functional safety. For example, monitoring concepts for measurement transducers are described in European patent EP 2 613 463 A2, published international applications WO 2005/017851 A1, WO 03/060851 A1, and European patent EP 1 697 803 B1.

In order'to meet SIL 2, and for the sake of an as high as possible fault detection rate and proportion of so-called Safe Failure Fractions (SFF), diagnostic measures are generally employed in the form of redundant hardware. For example, an additional logic unit for monitoring the main electronic system is located inside the transmitter.

Additional production costs and increased space requirements are incurred due to the additional components required for redundant diagnostics. Also, every additional component requires electrical power, which may be particularly critical with two-wire HART interfaces, where available power is limited.

BRIEF SUMMARY OF THE INVENTION

As such, it is the object of the present invention to provide a measurement transducer, which can achieve a monitoring of its functions with less effort compared to the prior art.

According to the invention, the object is attained by a measurement transducer which;

comprises a sensor module having at least one sensor and sensor electronics, wherein the sensor emits sensor signals, and wherein the sensor electronics processes the digitized sensor signals with a transmission function and provides processed sensor measurement values on a digital interface; and a main electronics module, which is functionally connected to the sensor electronics, wherein the main electronics module has a logic unit, e.g., a micro-controller and a communications interface, wherein the logic unit is configured to receive the sensor measurement values provided on the digital interface and to cause the output of a measurement signal corresponding to the sensor measurement values through the communications interface, wherein the logic unit is configured to carry out a monitoring function—wherein the monitoring function comprises, in addition to a currently provided sensor measurement value, the reception of the associated digitized sensor signals, with the aid of a test, which comprises the transmission function—to calculate a control measurement value with the aid of the received associated digitized sensor signals, to carry out a comparison between the control measurement value and the sensor measurement value, and to cause the communications interface to emit an error signal in the event of deviations, wherein the logic unit is further configured to provide the control measurement value to the sensor electronics, wherein the sensor electronics unit is configured to carry out a comparison between the control measurement value and the sensor measurement value, and to directly cause the communications interface to emit an error signal in the event of deviations.

In particular, the communications interface may comprise a power output, wherein the error signal may comprise a residual current of less than 4 mA or greater than 20 mA.

In a further development of the invention, the transmission function comprises an algorithm, which is configured to compensate for sensor cross-sensitivity to disturbance variables and/or provide a linear sensor measurement value function.

In a further development of the invention, the test function comprises a testing algorithm, which, in addition to an implementation of the transmission function, comprises additional steps, wherein the testing algorithm comprises an inverse step for each additional step, to the effect that, ultimately, with proper execution of the testing algorithm and proper functioning of the microprocessor, the control measurement value is not modified by the additional steps.

In a further development of the invention, the further steps include arithmetic operations, each of them in combination with this inverse operation—particularly, addition, subtraction, multiplication, and division.

In a further development of the invention, the further steps include references or branching out of the algorithm of the transmission function and back.

In a further development of the invention, the sensor electronics is configured to provide the sensor measurement values with a defined output rate on the digital interface, wherein the logic unit is configured to monitor whether or not the output rates are met, and, if this is not the case, cause the communications interface to emit an error signal.

In a further development of the invention, the monitoring function must be carried out in defined temporal intervals, wherein the execution of the monitoring function needs to be initiated primarily by the logic unit, wherein the sensor electronics monitors whether or not the time lag for initiating the monitoring function is satisfied.

In a further development of the invention, the logic unit is configured to provide the control measurement value within a predetermined processing time after reception of the digitized sensor signals, wherein the sensor electronics is configured to monitor whether the predetermined processing time is satisfied.

In a further development of the invention, the sensor electronics is configured to directly cause the communications interface to emit an error signal if a period of time to be monitored by the sensor electronics and to be satisfied by the logic unit is not satisfied.

In a further development of the invention, the sensor electronics is configured to read the control measurement value provided by the logic unit from a register and to write an error value, which is outside the domain of all possible control measurement values, to the register after readout of the control measurement value from the register, wherein, when functioning properly, the logic unit is configured to overwrite the error value with the subsequent control measurement value before the sensor electronics reads out the register the next time.

In a further development of the invention, the sensor electronics is configured to read the control measurement value provided by the logic unit from a register, and to write an error value to the register, which is outside the domain of all plausible control measurement values, after readout of the control measurement value from the register, wherein, when functioning properly, the logic unit is configured to overwrite the error value with the subsequent control measurement value before the sensor electronics reads out the register the next time.

In a further development of the invention, the sensor electronics is configured to write the digitized sensor signals, which form the basis for the calculation of sensor measurement values, as error value to the register, in order to provide to the logic unit the digitized signals to determine the control measurement value, wherein, when functioning properly, the logic unit is configured to overwrite the digitized sensor signals, which, at the same time, serve as error value, with the next control measurement value, which was determined based upon the digitized sensor signals.

In particular, the inventive measurement transducer may be a pressure transducer, a flow-rate transducer, a filling level transducer, a temperature transducer, a pH transducer, a conductivity transducer, a density transducer, a toughness transducer, or a measurement transducer for any other process parameter. In particular, the communications interface of the measurement transducer may comprise an interface featuring a power output between 4 mA and 20 mA as signal current for the output of the measured value with a residual current outside this range of values, wherein a digital signal according to the HART standard can be modulated upon the analog current signal. Basically, the communications interface can also meet other standards, e.g., the PROFIBUS standards, or the FOUNDATION fieldbus standard.

In particular, the sensor module can have a first housing, within which the sensor electronics are arranged, wherein the main electronic module has a second housing, within which the logic unit and the communications interface are arranged.

BRIEF DESCRIPTION OF THE DRAWINGS

The invention is now explained in further detail below on the basis of an embodiment of an inventive measurement transducer shown in the drawing. Illustrated are:

FIG. 1: is a schematic block diagram of an embodiment of an inventive measurement transducer.

DETAILED DESCRIPTION OF THE PREFERRED EMBODIMENTS

The measurement transducer 1 illustrated in FIG. 1 comprises a sensor module 10 and a main electronic module 20, which are connected via digital communications interfaces 16, 24, which are complementary to one another.

The sensor module 10 comprises a sensor element 11, e.g., a pressure sensor with a capacitive or resistive pressure transducer, and a sensor electronics 12, e.g., in the form of ASICs, wherein the primary signals of the pressure transducer are received on an analog sensor input 14 of the sensor electronics 12, and are subsequently digitized by the sensor electronics and processed by a transmission function, wherein the processing by means of the transmission function comprises an algorithm of a digital signal processor DSP in order to provide a digital sensor measurement value on a first digital communications interface 16.

The main electronic module 20 comprises a logic unit 22, e.g., a micro-controller, a current controller 32, a HART modem 34, and a current sink 36. The logic unit comprises a second digital communications interface 24, which communicates with the first digital communications interface 16. For example, during regular measurement operation, the digital sensor measurement value is transmitted via this communications interface, and the logic unit 22 causes the current controller 32, via a third digital communications interface 26, to control the current sink 36 in a way that it sets an analog current signal, which represents the digital sensor measurement value or a measured variable derived therefrom. Furthermore, the logic unit 22 comprises a fourth digital communications interface 30, via which the HART modem is triggered in order to modulate digital information, e.g., status information, onto the analog current signal. Finally, the logic unit 22 comprises an alarm output 28, which directly accesses the current sink 36, in order to cause the latter to set a residual current without involving the current controller 32.

The logic unit 22 is further configured to monitor the proper signal processing with the transmission function by the sensor electronics 12. For this purpose, not only the current digital sensor measurement values, but also the digitized primary signals associated with these sensor measurement values, are periodically requested and read out through the second digital communications interface, e.g., every 100-1000 measuring cycles. The digital sensor measurement values provided by the sensor electronics are initially stored, then control measurement values are calculated by the CPU of the logic unit 22 with the aid of the read out digitized primary signals, using an algorithm, which comprises the transmission function used by the sensor electronics, while control measurement values are each compared with stored sensor measurement values, wherein the logic unit 22 is configured to cause the setting of a residual current through the third communications interface 26, or via the alarm output 28, in the event of a deviation.

The inventive measurement transducer 1 further provides the opportunity to monitor the micro-controller 22 with respect to its functional capability. For this purpose, it is arranged that the logic unit 22 provides the calculated control measurement values to the second digital interface 24, so that the sensor electronics 12 are able to read them out. Then, the sensor electronics compare the sensor measurement values with the calculated control measurement values, and, in the event of detected deviations, directly cause the current sink 36 to set a residual current via an alarm output 18, thus bypassing the logic unit 22.

Through this monitoring of the logic unit 22 by the sensor electronics, at least all those operations of the logic unit are monitored that are absolutely necessary for calculation of the control measurement values.

However, there is a possibility of extending the monitoring of the logic unit 22 by operations that are not really necessary for recomputation of the transmission function. For example, if arithmetic operations, such as multiplication, are not present in the computation of the transmission function, the logic unit can multiply a final result or an intermediate value by an arbitrary factor and subsequently divide it by this factor. With the logic unit operating properly as regards multiplication and division, this should not cause any change in the final result of the calculation, provided that potential overflows are taken account of. Accordingly, the same applies regarding other arithmetical operations and their inverses. Likewise, the write and read function of the logic unit 22 can be tested by first writing one value to a memory, subsequently reading it out, and processing it further. Likewise, branches to other routines that need to be checked may be provided for, as long as the return to the calculation and preparation of the control measurement value is ensured when the logic unit works properly.

In this way, arbitrary operations from the instruction set of the logic unit 22, which are not relevant for the computation of a control measurement value, but which result in a change in the control measurement value, or cause the abortion of the computation of the control measurement value, can be included in the test function. This will be detected by the sensor electronics by means of a simple value comparison, and ultimately results in the output of an error signal.

The sensor electronics 12 can further be configured to monitor the functioning of the logic unit 22 with regard to time. To this effect, the logic unit 22 can be configured to initiate the execution of the monitoring function in specified temporal intervals, for which it requests a value tuple from the sensor electronics 12, for example, which also includes digitized sensor signals in addition to the usual digital sensor measurement value. The sensor electronics can monitor the time elapsed since the previous request and can trigger an alarm via the alarm output 18, if a limit value has been exceeded for this time span.

Furthermore, the sensor electronics can monitor the time span that the logic unit needs to calculate the control measurement values with the aid of the provided digitized sensor signals. Should the sensor electronics 12 determine that the required time span exceeds a predetermined limit value, the sensor electronics 12 can also initiate the setting of a residual current via the alarm output 18. In the end, it is imaginable that a sensor element outputs the same primary signal several times in an row for a specified period of time. In this case, the monitoring of the logic unit 22 by the sensor electronics 12 would fail, if the logic unit 22 does not provide updated control measurement values, since the previously provided control measurement value might still be correct. In order to avoid this source of error, the sensor electronics can be configured to write such a value, which is outside the domain of all plausible control measurement values, into the register, after reading out from a register a control measurement value that was previously provided by the logic unit. If this value is not overwritten when the monitoring function is performed the next time, it is obvious that an error is present, which is detected by the sensor electronics 12 by means of the value comparison provided for, and signaled via the alarm output 18.

LIST OF REFERENCE NUMBERS

1 Measurement transducer
10 Sensor module
11 Sensor element
12 Sensor electronics
13 digital signal processor (DSP)
14 Communications interface
15 Memory
16 Communications interface
18 Alarm output
20 Main electronic module
22 Logic unit
24 Communications interface
26 Communications interface
28 Alarm output
30 Communications interface
32 Current controller
34 HART modem
36 Current sink

The invention claimed is:

1. A measurement transducer, comprising:
a sensor module having at least one sensor element and one sensor electronics,
wherein said at least one sensor element emits sensor signals, and said one sensor electronics converts said sensor signals into digitized sensor signals, processes the digitized sensor signals with a transmission function and provides processed sensor measurement values on a digital interface; and
a main electronic module, which is functionally connected to said one sensor electronics, said main electronic module has a logic unit and a communications interface, wherein:
said logic unit is configured to receive the sensor measurement values provided on the digital interface and to cause the output of a measurement signal corresponding to the sensor measurement values through said communications interface;
said logic unit is configured to carry out a monitoring function, the monitoring function comprises:
  to receive, in addition to a currently provided sensor measurement value, digitized sensor signals associated with said currently provided sensor measurement value, wherein the currently provided sensor measurement value has been obtained by said processing of said associated digitized sensor signals with said transmission function by said one sensor electronics;
  to calculate, with the aid of a test function, a control measurement value based on the received associated digitized sensor signals, wherein the test function comprises said transmission function;
  to carry out a comparison between the control measurement value and the currently provided sensor measurement value; and
  to cause the communications interface to emit an error signal in the event of deviations;
said logic unit is further configured to provide the control measurement value to said one sensor electronics;
said one sensor electronics is configured to carry out a comparison between the control measurement value and the currently provided sensor measurement value and to cause the communications interface, via an alarm output, to directly emit an error signal in the event of deviations;
said one sensor electronics is configured to read the control measurement value provided by said logic unit from a register and to write an error value to the register after readout of the control measurement value from the register, wherein said error value is a value which is outside a domain of all plausible control measurement values, the domain of all plausible control measurement values being a domain of control measurement values that can be obtained if the logic unit operates without errors;
said logic unit is configured to overwrite the error value with the subsequent control measurement value before said one sensor electronics reads out the register the next time; and
if the error value is not overwritten before said one sensor electronics reads out the register the next time, said one sensor electronics reads out the error value and detects an error.

2. The measurement transducer according to claim 1, wherein:

the transmission function comprises an algorithm which is configured to compensate for sensor cross-sensitivity to disturbance variables and/or provide a linear sensor measurement value function.

3. The measurement transducer according to claim 1, wherein:
the test function comprises a testing algorithm which, in addition to an implementation of the transmission function, comprises additional steps; and
the testing algorithm comprises an inverse step for each additional step, to the effect that, as a result, with proper execution of the testing algorithm and proper functioning of said microprocessor, the control measurement value is not modified by the additional steps.

4. The measurement transducer according to claim 3, wherein:
said further steps comprise arithmetic operations, each of them in combination with an operation inverse to it.

5. The measurement transducer according to claim 3, wherein:
said further steps comprise branching out of the algorithm of the transmission function and back.

6. The measurement transducer according to claim 1, wherein:
said one sensor electronics is configured to provide the sensor measurement values with a defined output rate on the digital interface; and
said logic unit is configured to monitor whether the output rates are met, and, if this is not the case, cause the monitoring function communications interface to emit an error signal.

7. The measurement transducer according to claim 1, wherein:
the monitoring function is carried out in defined temporal intervals;
the execution of the monitoring function is initiated by said logic unit; and
said one sensor electronics monitors whether or not a time lag for initiating the monitoring function is satisfied.

8. The measurement transducer according to claim 1, wherein:
said logic unit is configured to provide the control measurement value within a predetermined processing time after reception of the digitized sensor signals;
said one sensor electronics is configured to monitor whether or not a predetermined processing time is satisfied, and
said one sensor electronics is configured to directly cause the communications interface to emit an error signal if a period of time to be monitored by said one sensor electronics and to be satisfied by said logic unit is not satisfied.

* * * * *